United States Patent [19]

Nakatani et al.

[11] Patent Number: 5,004,640

[45] Date of Patent: Apr. 2, 1991

[54] MULTILAYERED CERAMIC SUBSTRATES AND METHOD FOR MANUFACTURING THE SAME

[75] Inventors: Seiichi Nakatani; Satoru Yuhaku, both of Osaka; Tsutomu Nishimura, Kyoto; Yukio Terada, Osaka; Yasuyuki Baba, Niihama, all of Japan

[73] Assignee: Matsushita Electric Industrial Co., Ltd., Japan

[21] Appl. No.: 321,702

[22] Filed: Mar. 10, 1989

[30] Foreign Application Priority Data

Mar. 11, 1988 [JP] Japan .................................. 63-58752

[51] Int. Cl.$^5$ .......................................... B32B 3/00
[52] U.S. Cl. ...................................... 428/195; 174/255; 361/397; 428/209; 428/210; 428/426; 428/432; 428/433; 428/702; 428/901; 501/127; 501/128; 501/153
[58] Field of Search ............... 428/195, 209, 210, 426, 428/432, 433, 698, 702, 901; 361/397; 174/68.5; 501/153, 127, 128, 8

[56] References Cited

U.S. PATENT DOCUMENTS

| | | | |
|---|---|---|---|
| 3,892,904 | 7/1975 | Tanaka | 428/209 |
| 3,914,517 | 10/1975 | Pirooz | 428/433 |
| 4,234,367 | 11/1980 | Herron et al. | 156/89 |
| 4,396,682 | 8/1983 | Mohri et al. | 428/428 |
| 4,414,281 | 11/1983 | Hoda | 428/432 |
| 4,504,339 | 3/1985 | Kamehara et al. | 156/89 |
| 4,536,435 | 8/1985 | Utsumi et al. | 428/433 |
| 4,621,066 | 11/1986 | Nishigaki et al. | 501/128 |
| 4,649,125 | 3/1987 | Takeuchi et al. | 501/15 |
| 4,679,320 | 7/1987 | Imanaka et al. | 156/89 |
| 4,687,540 | 8/1967 | Singhdeo et al. | 428/433 |
| 4,714,570 | 12/1987 | Nakatani et al. | 252/518 |
| 4,725,333 | 2/1988 | Leedecke et al. | 428/433 |
| 4,812,422 | 3/1989 | Yuhaku et al. | 501/153 |
| 4,853,349 | 8/1989 | Martin | 501/8 |

FOREIGN PATENT DOCUMENTS 0163155 12/1985 European Pat. Off.
0243626 11/1987 European Pat. Off.

OTHER PUBLICATIONS

Database Derwent Abstracts, Abstract Acc. No. 88-295864/42, Derwent Publications Ltd, London, GB; and JP-A-63 215 559 (NGK Insulators K.K.), 08-09-1988.

*Primary Examiner*—Patrick J. Ryan
*Assistant Examiner*—Archene A. Turner
*Attorney, Agent, or Firm*—Lowe, Price, LeBlanc, Becker & Shur

[57] ABSTRACT

Multilayered ceramic substrates having Cu electrode patterns in or on ceramic-glass insulating layers which consist essentially of $Al_2O_3$, $SiO_2$, $B_2O_3$, $Na_2O$, $K_2O$, CaO, MgO and PbO. The methods for manufacturing the substrate comprises thermally treating a laminate of alternately superimposing ceramic-glass insulating layers and CuO-based electrode layers of desired patterns in air or in a molecular oxygen-containing atmosphere to eliminate organic binders from the laminates by burning out, reducing the CuO into metallic Cu at low temperatures in an atmosphere containing hydrogen, and firing the thus reduced laminate in an inert gas such as nitrogen. The firing is effected at 850° to 950° C. The multilayered ceramic substrate may also be obtained by forming ceramic-glass insulating layers and CuO-based electrode layers alternately on a sintered ceramic support, followed by the thermal treatment, reduction and firing set forth above.

5 Claims, 5 Drawing Sheets

FIG. 6a $\Delta L < 1\%$

NO DEFORMATION

FIG. 6b $\Delta L > 1\%$

DEFORMED

FIG. 7

MULTILAYERED CERAMIC SUBSTRATES AND METHOD FOR MANUFACTURING THE SAME

BACKGROUND OF THE INVENTION

1. Field of the Invention

This invention relates to multilayered ceramic substrates for mounting semiconductor or integrated circuit chips thereon for interconnection thereof. The invention also relates to a method for manufacturing the substrates, a composition for insulating substrate materials.

2. Description of the Prior Art

In the fabrication of multilayered ceramic substrates, it is usual to employ, as a conductor material, noble metals such as Au, Ag, Pd or mixtures thereof. Because of the expensiveness and a great variation of the cost of these noble metals, attempts have been made to use Cu electrode materials which are inexpensive and low in resistance and have good solderability.

A typical method of fabricating a multilayered ceramic substrate using Cu electrodes is one which comprises screen-printing a Cu paste on a sintered substrate such as of alumina to form a circuit pattern and, after drying, firing the printed substrate at a temperature which is lower than the melting point of Cu, e.g. 850° to 950° C. in a nitrogen atmosphere having a controlled oxygen partial pressure sufficient to cause the organic components in the conductor paste to be fully burnt out without oxidation of the copper. A dielectric paste is subsequently printed and fired under similar conditions. For obtaining a multilayered structure, the above procedure for the formation of the electrode pattern and the dielectric layer is repeated until a desired number of the layers are formed.

However, the use of the Cu paste involves several problems. One of the problems is a difficult in properly controlling the oxygen partial pressure in the firing atmosphere during the firing step. If oxygen is contained in excess in the atmosphere, Cu is oxidized. On the contrary, if the oxygen content is less, the organic components contained in the paste are not decomposed as desired and metallization cannot be appropriately attained. Another problem is that formation of the multilayered structure requires repetition of firing whenever the respective pastes are printed. Thus, the lead time is prolonged, thus leading to the rise in equipment costs.

U.S. Pat. No. 4,234,367 describes a method of making multilayered glass-ceramic structures having copper-based conductors. In the method, copper-based conductors are metallized by appropriate combinations of a nitrogen atmosphere and a hydrogen atmosphere containing water vapor. However, the precise atmospheric control of water vapor and hydrogen is minute and very difficult.

U.S. Pat. No. 4,679,320 sets forth a process for producing a multilayer ceramic circuit board wherein a thermally depolymerizable resin binder and fatty acid ethylene oxide adduct type deflocculants are used as organic components. In this patent, complete removal of the organic components by decomposition in a nitrogen atmosphere is stated as not easy. A similar process is also described in U.S. Pat. No. 4,504,339.

Moreover, U.S. Pat. No. 4,649,125 teaches a process wherein inorganic peroxides such as $CaO_2$, $SrO_2$, $BaO_2$ and the like are added to glass compositions for multilayered substrates in order to facilitate burning out of organic binders upon firing. The oxygen emitted during decomposition of the peroxide is used to oxidize residual carbon as would be left when the organic binder is decomposed, thereby eliminating the organic binder in the form of $CO_2$.

In all the processes, however, the atmospheres for firing have to be undesirably controlled depending upon the type and amount of glass or ceramic to be fired since the organic binders are burnt out during the course of firing.

On the other hand, U.S. Pat. No. 4,714,570 proposes a process of fabricating multilayered ceramic substrates which is different from those of the above U.S. patents. The process comprises a burning-out step, a reduction step and a densification or firing step. In this process, a metal oxide such as cupric oxide is used as a starting material for conductor and the burning-out step is effected in an oxidative atmosphere containing oxygen in amounts sufficient to burn out carbon atoms contained in the binder used while heating at a temperature sufficient for thermal decomposition of the organic binder inside the multilayered ceramic substrate. Following the burning-out step, the metal oxide is reduced to elemental metal in the reduction step, and sinterings of materials for the substrate and the elemental metal are conducted simultaneously to form an integral monolithic product in the densification step. As will be apparent from the above, the binder has been removed in the burning-out step, so that the atmospheric control for the sintering becomes very easy. In addition, since the organic binder has been completely eliminated, a dense sintered product with good insulating characteristics can be obtained irrespective of the amount of materials to be sintered.

However, the above process involves some problems. More particularly, the materials used as the multilayered ceramic substrate suffer contraction during the sintering process, which is significantly different from a rate of contraction of a metal such as copper used as the conductor material. This undesirably leads to warpage and deformation of the multilayered substrate. Especially, when copper is used as the conductor material, limitation is placed on the composition of the substrate material since copper is lower in temperature at which contraction or sintering commences. Another problem resides in wettability of solder to a Cu conductor pattern formed at the top layer. When the multilayered ceramic substrate is applied as a circuit board, this presents a serious problem. The wettability is influenced not only by the composition or type of conductor material, but also by the composition of the ceramic substrate material. This is because the ceramic substrate material contains glass components for the purpose of sintering or firing at low temperatures. The low softening point glass materials tend to exude, at the time of sintering, to the surface of the electrode formed as the top layer. Presumably, this is the reason why the solderability is impeded.

It will be noted that the substrate materials should generally have high folding endurance, good insulating properties and good dielectric characteristics and should be sintered within a short time at low temperatures of not higher than about 1000° C.

SUMMARY OF THE INVENTION

It is accordingly an object of the invention to provide a multilayered ceramic substrate having copper as a conductor material which is adapted for use in ceramic circuit boards, hybrid integrated circuits and large scale circuits and which is substantially free of warpage with good matching between the copper conductor and the dielectric substrate material.

It is another object of the invention to provide a multilayered ceramic substrate having a copper electrode pattern at the top thereof which exhibits good solderability.

It is a further object of the invention to provide a composition for multilayered ceramic substrate which has good electric insulating and dielectric properties and can be sintered at low temperatures within a short time.

It is a still further object of the invention to provide a method for manufacturing a multilayered ceramic substrate having electrode patterns of metallized copper which has good solderability, low resistance and good resistance to migration with good economy.

It is another object of the invention to provide a method for manufacturing a multilayered ceramic substrate whereby a multilayered ceramic substrate having good electric insulating properties and reliable solderability can be obtained inexpensively.

According to one embodiment of the invention, there is provided a multilayered ceramic substrate which comprises a multilayered structure having electrode patterns of copper and ceramic layers laminated alternately, the ceramic layers consisting essentially of 45 to 60 wt % of $Al_2O_3$, 24 to 33 wt % of $SiO_2$, 2.4 to 3.3 wt % of $B_2O_3$, 1.2 to 1.65 wt % of $Na_2O$, 0.8 to 1.1 wt % of $K_2O$, 3.2 to 4.4 wt % of CaO, 1.2 to 1.65 wt % of MgO and 7.2 to 9.9 wt % of PbO. The copper pattern should preferably be formed on at least one outer side of the substrate as exposed and more preferably on opposite sides. In addition, the ceramic layers may be provided with through holes in which the copper electrode is filled to interconnect the electrode patterns on the respective ceramic layers as desired. The ceramic substrate may be formed on one or both sides of a sintered support such as of alumina, if desired.

According to another embodiment of the invention, there is also provided a method for manufacturing a multilayered ceramic substrate having internal and external copper electrodes in desired patterns. The method comprises: (a) forming a green sheet comprised of a glass-ceramic powder, and an organic binder and a plasticizer therefor, both capable of being burnt out in a subsequent step; (b) forming an electrode pattern based on cupric oxide on one side of the green sheet; (c) repeating the above steps (a) and (b) to form a desired number of green sheets having electrode patterns thereon; (d) superimposing the green sheets obtained in (b) and (c) and laminating the superimposed green sheets; (e) thermally treating the laminate in an atmosphere containing oxygen at a temperature of from 500° C. to 750° C. for a time sufficient to burn the organic binder and plasticizer out; (f) further thermally treating the laminate obtained in (e) in an atmosphere of a mixed gas of not less than 10 vol % of hydrogen and the balance of an inert gas to reduce the cupric oxide into metallic copper at a temperature not higher than 600° C.; and (g) firing the laminate in an atmosphere of an inert gas at a temperature of 850° to 950° C. The glass-ceramic powder used for this purpose consists essentially of 45 to 60 wt % of $Al_2O_3$, 24 to 33 wt % of $SiO_2$, 2.4 to 3.3 wt % of $B_2O_3$, 1.2 to 1.65 wt % of $Na_2O$, 0.8 to 1.1 wt % of $K_2O$, 3.2 to 4.4 wt % of CaO, 1.2 to 1.65 wt % of MgO and 7.2 to 9.9 wt % of PbO.

According to a further embodiment of the invention, there is provided a method for manufacturing a multilayered ceramic substrate which comprises (A) providing a sintered ceramic insulating support, (B) forming an electrode conductor pattern based on cupric oxide on the support; (C) forming a layer of an insulating material comprised of a glass-ceramic powder, and an organic binder and a plasticizer therefor, both capable of being burnt out in a subsequent step; (D) repeating the steps (B) and (C) to form a desired number of the electrode patterns and the insulating layers alternately, thereby forming a multilayered structure on the support; (E) thermally treating the multilayered structure in an atmosphere containing oxygen at a temperature of from 500° C. to 750° C. for a time sufficient to burn the organic binder out; (F) further thermally treating the multilayered structure obtained in (E) in an atmosphere of a mixed gas of not less than 10 vol % of hydrogen and the balance of an inert gas to reduce the cupric oxide into metallic copper at a temperature not higher than 600° C.; and (G) firing the multilayered structure in an atmospheric of an inert gas at a temperature of 850° to 950° C. The ceramic-glass materials referred to above may be used for providing the sintered ceramic support.

In this method, it is preferable to form a wiring pattern on the top of the multilayered ceramic substrate by application of a Cu metal powder paste in a desired pattern and firing in an atmosphere of an inert gas at a temperature of from 600° to 950° C.

A typical and preferable inert gas used in the reduction and firing steps of the respective embodiments is nitrogen.

DETAILED DESCRIPTION AND EMBODIMENTS OF THE INVENTION

Figure 1:
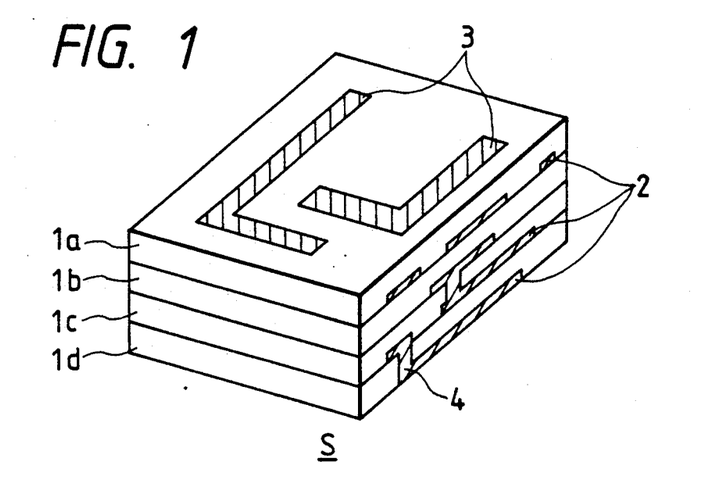
FIG. 1 is a schematic perspective view showing a multilayered ceramic substrate having copper electrode patterns therein and thereon according to one embodiment of the invention.

Reference is now made to the accompanying drawings and particularly, FIG. 1, which shows a typical example of a multilayered ceramic substrate having Cu conductor patterns. In the figure, there is generally shown a multilayered ceramic substrate S having four ceramic insulating layers 1a, 1b, 1c and 1d. The substrate S also has internal conductors 2 and an outermost conductor pattern 3. The substrate has through holes 4 in which the internal conductors are filled. In this figure, the four insulating layers each having internal conductors 2 are shown, but a desired number of insulating layers may be laminated in the practice of the invention.

The present invention is characterized in that a specific ceramic-glass composition is used as the multilayered ceramic substrate of the invention. The composition comprises 45 to 60 wt % of $Al_2O_3$, 24 to 33 wt % of $SiO_2$, 2.4 to 3.3 wt % of $B_2O_3$, 1.2 to 1.65 wt % of $Na_2O$, 0.8 to 1.1 wt % of $K_2O$, 3.2 to 4.4 wt % of CaO, 1.2 to 1.65 wt % of MgO and 7.2 to 9.9 wt % of PbO. The use of the composition is advantageous in that the composition has good electric properties, is able to be sintered at low temperatures within a short time and ensures good solderability of the conductor pattern formed on the top of the substrate. The advantages of the composition have been experimentally confirmed as will be particularly described in examples appearing hereinafter. As is known in the art, ceramic-glass compositions will exhibit significantly different properties even though the difference in composition is only very slight. The composition of the invention is determined by using several glass compositions to which different amounts of an $Al_2O_3$ ceramic material are added.

The multilayered ceramic substrate may have through holes for interconnecting conductor patterns formed on the respective layers of the ceramic-glass composition. Moreover, the substrate may be formed on a support of a sintered product of ceramics such as $Al_2O_3$.

The multilayered ceramic substrate is manufactured by a method according to the invention. The manufacturing method comprises initially forming a green sheet comprised of a glass-ceramic powder, and an organic binder and a plasticizer, both capable of being burnt out in a subsequent step. The formation of the green sheet is effected using a paste of a ceramic-glass powder, an organic binder and a plasticizer in an organic solvent. The ceramic-glass powder may be prepared by any known manner to have a size of from 1 to about 3 micrometers. The organic binder may be any binders ordinarily used for these purposes and include, for example, polyvinyl butyral resins, cellulose derivatives such as ethyl cellulose, acrylic and methacrylic resins, polyvinyl alcohol, and the like. These resins may be used singly or in combination and are generally used several to several tens wt % of the solids in the paste. The plasticizers may be phthalic acid esters such as di-n-butyl phthalate, benzyl-n-butyl phthalate, di-(2-ethylhexyl) phthalate, dinonyl phthalate and the like, aliphatic dibasic acid esters such as di(2-ethylhexyl) adipate, di(2-ethylhexyl) sebacate and the like, glycol esters such as polyethylene glycol esters, and the like. Mixtures of the plasticizers may also be used. Of these, the phthalic acid esters are preferred. The amount of the plasticizer may depend upon the type of binder. The solvents for the resins may be any solvent capable of dissolving such resins and including, for example, aliphatic or aromatic hydrocarbons such as toluene, xylene, n-hexane and the like, alcohols such as methyl alcohol, ethyl alcohol, isopropyl alcohol and the like, ketones such as methyl ethyl ketone, esters such as n-butyl acetate, and the like. These solvents may be used singly or in combination. The paste is applied onto, for example, an organic film and dried to form a green sheet. The application of the paste may be carrier out by any known coating techniques including a doctor blading, a roll coating, calendering and the like.

Next, an electrode pattern is formed on the green sheet. For this purpose, there is used a cupric oxide paste comprising a cupric oxide precursor powder having preferably a size of from 0.5 to 5 micrometers, an inorganic binder such as glass frit and an organic binder as used in the first step dissolved and dispersed in an appropriate vehicle. The inorganic binder is used to impart adhesion strength to the electrode pattern and is generally used in an amount of from 0.5 to 7 wt % of the total of the cupric oxide and the inorganic binder. Inorganic binders other than glass frit include, for example, $MnO_2$, $CuAl_2O_4$, and the like. The vehicles used in this step may be turpentine oil, n-butyl carbinol, higher alcohols such as oleyl alcohol, and the like, The vehicle composition is applied onto the green sheet in a desired pattern by a printing technique such as a screen printing as is known in the art.

The above steps of the formation of the green sheet and the electrode pattern are repeated to form a desired number of green sheets having electrode patterns thereon. These green sheets are stacked or superimposed one on another for lamination. The lamination is effected by compressing the superposed sheets at a relatively low temperature of approximately 50° to 150° C. at a pressure of 50 to 200 kg/cm$^2$.

In the practice of the invention, the following steps are important. The laminate is subsequently subjected to a first thermal treatment for burning out the organic binder and plasticizer used in the green sheets having the electrode patterns, a second thermal treatment for reducing the cupric oxide in the patterns into metallic copper, and firing for obtaining a dense substrate.

The first thermal treatment of the laminate is effected in an atmosphere containing oxygen at a temperature of from 500° C. to 750° C. for a time sufficient to burn the organic binder out. In general, the laminate is gradually heated from ambient temperatures, kept at a temperature within the defined range for several hours and cooled down gradually although not critical. The atmosphere used is usually air, but a molecular oxygen-containing gas may be used. It is important that the thermal treatment be carried out at the defined temperature. At temperatures below 500° C., the removal of the organic binder by burning out is not satisfactory. Over 750° C., the CuO may be sintered to a degree, making it difficult to completely reduce the CuO into elemental Cu. During the first treatment, the cupric oxide and the ceramic-glass powder are assumed to undergo a reaction to form an intermediate reaction layer at the interface of the green sheet and the electrode layer. This intermediate layer is considered to have good action on matching between the green sheet and the electrode layer, minimizing occurrence of warpage or deformation of a final product.

In the second thermal treatment, the burnt-out laminate is treated in an atmosphere of a mixed gas containing not less than 10 vol % of hydrogen and the balance of an inert gas such as nitrogen to reduce the cupric oxide into metallic copper at a temperature of not higher than 600° C. The atmosphere should preferably consist substantially of 100% by volume of hydrogen. If the thermal treatment is effected in an atmosphere containing 10 vol. % of hydrogen for 1 hour, the reduction starts at about 200° C. However, if the temperature over 600° C., PbO which is most likely to reduce among the ceramic-glass components used in the present invention will be reduced. Preferably, the reduction temperature is in the range of 200° to 300° C., within which other oxide components suffer little adverse influence of the reduction.

In the final firing step, the glass-ceramic insulating layers are densified. In this step, the laminate is fired in a non-oxidative atmosphere where the once reduce copper will not be oxidized. The firing in the non-oxidative atmosphere is possible since the organic binder and plasticizer have been already removed and the cupric oxide has been reduced into metallic copper. In view of the thermodynamic equilibrium oxygen partial pressure for Cu, the non-oxidative atmosphere should be an atmosphere of an inert gas such as $N_2$ containing not larger than several tens ppm of $O_2$ when the firing temperature is in the range of 850° to 950° C. This means that a minute control of the $O_2$ concentration in the atmosphere is not necessary, thus a commercially available belt furnace for $N_2$ atmosphere is satisfactorily usable.

In the reduction and firing steps, it is usual but not essential that, as in the burning out step, the substrate is thermally treated by gradually heating it from ambient temperatures to a desired level, at which the substrate is kept for a certain time and finally cooled down to ambient temperatures. By this, the substrate can be appropriately treated without involving any defects as would occur when the temperature change is sharp.

In accordance with the another embodiment of the invention, a sintered product in the form of a sheet or plate of ceramics such as $Al_2O_3$, BeO and the like is used as a support. In addition, ceramic-glass compositions used to form the dielectric layer in the foregoing embodiments may also be used. On the support, a paste of a ceramic-glass powder as used in the above method is applied and dried to form an insulating layer. Subsequently, a cupric oxide paste as used in the above embodiment is applied in a desired pattern and dried. The above procedures are repeated to alternately form a desired number of insulating layers and electrode patterns. The alternate formation is preferably conducted by printing techniques such as screen printing. The resultant product is subjected to the first and second thermal treatments and firing in the same manner as set forth above, thereby forming a multilayered ceramic substrate. This method is advantageous in that warpage of the substrate hardly occurs since the sintered ceramic support is used.

In the embodiments resulting to the manufacture of the multilayered ceramic substrates, an outermost electrode layer of a desired pattern may be formed using a Cu paste after completion of the final firing step of the respective embodiments. In this case, a cupric oxide paste should not be formed on an uppermost green sheet of insulating layer. By this, wettability of solder on the uppermost electrode layer may be improved. The Cu paste is fired in an atmosphere of an inert gas such as nitrogen at a temperature of from 600° to 950° C.

The present invention is more particularly described by way of examples.

EXAMPLE 1

Three glass materials G-1, G-2, and G-3 having the following compositions were prepared.

TABLE 1

|  | G-1 | (wt %) | G-2 | G-3 |
| --- | --- | --- | --- | --- |
| $Al_2O_3$ | — |  | — | 18 |
| $SiO_2$ | 59 |  | 60 | 48 |
| $B_2O_3$ | 6.9 |  | 6 | 1 |
| $Na_2O$ | 2.4 |  | 3 | — |
| $K_2O$ | 2.2 |  | 2 | 1 |
| CaO | 5.7 |  | 8 | 8 |
| MgO | 5.2 |  | 3 | 3 |
| BaO | — |  | — | 6 |
| PbO | 18.6 |  | 18 | 15 |
|  | 100 |  | 100 | 100 |

Each starting material having the above composition was pre-mixed and heated in an alumina crucible to a temperature of 1350° C. so that it was molten completely, followed by dropping into water. The resultant product was dried and coarsely ground to pieces by means of an automated mortar and passed through a 150 mesh sieve to obtain a powder. This powder was subsequently wet ground to such an extent that the average particle size was in the range of 1 to 2 micrometers.

EXAMPLE 2

The respective glass powder obtained in Example 1 were each mixed with different amounts of alumina powder for use as a ceramic-glass substrate composition. The alumina powder used had an average particle size of 1.8 micrometers. The substrate compositions are shown in Table 2 below. In the table, compositions of samples Nos. D1 to D5 are those compositions comprised of glass powder G-1 mixed with the alumina powder, e.g. sample No. D-1 has a composition comprised of a mixture of glass powder G-1 and the alumina powder in a mixing ratio by weight of 60:40. Sample Nos. D-6 to D-10 are mixtures of glass powder G-2 and the alumina powder and samples Nos. D-11 to D-15 are mixtures of glass powder G-3 and the alumina powder.

TABLE 2

| | Composition | | | | | | | |
| --- | --- | --- | --- | --- | --- | --- | --- | --- |
| | Glass Powder G-1 + Alumina | | | | | Glass Powder G-2 + Alumina | | |
| | Sample No. | | | | | | | |
| Components | D-1 | D-2 | D-3 | D-4 | D-5 | D-6 | D-7 | D-8 |
| $Al_2O_3$ | 40 | 45 | 50 | 55 | 60 | 45 | 50 | 55 |
| $SiO_2$ | 35.4 | 32.45 | 29.5 | 26.55 | 23.6 | 33 | 30 | 27 |
| $B_2O_3$ | 4.14 | 3.79 | 3.45 | 3.10 | 2.76 | 3.3 | 3.0 | 2.7 |
| $Na_2O$ | 1.44 | 1.32 | 1.2 | 1.08 | 0.96 | 1.65 | 1.5 | 1.35 |
| $K_2O$ | 1.32 | 1.21 | 1.1 | 0.99 | 0.88 | 1.1 | 1.0 | 0.9 |
| CaO | 3.42 | 3.13 | 2.85 | 2.56 | 2.28 | 4.4 | 4.0 | 3.6 |
| MgO | 3.12 | 2.86 | 2.6 | 2.34 | 2.08 | 1.65 | 1.5 | 1.35 |
| BaO | — | — | — | — | — | — | — | — |
| PbO | 11.16 | 10.23 | 9.3 | 8.37 | 7.44 | 9.9 | 9.0 | 8.1 |
| total (wt %) | 100 | 100 | 100 | 100 | 100 | 100 | 100 | 100 |
| | Composition | | | | | | | |
| | Glass Powder | | | | | | | |

TABLE 2-continued

|  | G-2 + Alumina | | Glass Powder G-3 + Alumina | | | | |
| --- | --- | --- | --- | --- | --- | --- | --- |
|  | Sample No. | | | | | | |
| Components | D-9 | D-10 | D-11 | D-12 | D-13 | D-14 | D-15 |
| $Al_2O_3$ | 60 | 65 | 50.8 | 54.9 | 59 | 63.1 | 67.2 |
| $SiO_2$ | 24 | 21 | 28.8 | 26.4 | 24 | 21.6 | 19.2 |
| $B_2O_3$ | 2.4 | 2.1 | 0.6 | 0.55 | 0.5 | 0.45 | 0.4 |
| $Na_2O$ | 1.2 | 1.05 | — | — | — | — | — |
| $K_2O$ | 0.8 | 0.7 | 0.6 | 0.55 | 0.5 | 0.45 | 0.4 |
| CaO | 3.2 | 2.8 | 4.8 | 4.4 | 4.0 | 3.6 | 3.2 |
| MgO | 1.2 | 1.05 | 1.8 | 1.65 | 1.5 | 1.35 | 1.2 |
| BaO | — | — | 3.6 | 3.3 | 3.0 | 2.7 | 2.4 |
| PbO | 7.2 | 6.3 | 9.0 | 8.25 | 7.5 | 6.75 | 6.0 |
| total (wt %) | 100 | 100 | 100 | 100 | 100 | 100 | 100 |

EXAMPLE 3

In this example, fabrication of a multilayered ceramic substrate is described.

Initially, a cupric oxide paste was prepared by providing an inorganic composition comprised of cupric oxide powder having an average size of 3 micrometers and a glass frit (#7059 glass powder with an average size of 3 micrometers, available from Corning Glass Works) as a glass binder for imparting adhesion strength in an amount of 5 wt % based on the composition. 80 parts by weight of the inorganic composition was dispersed in 20 parts by weight of a vehicle composition of 8 wt % of ethyl cellulose dissolved in turpentine oil, thereby obtaining a paste.

Separately, the ceramic-glass compositions indicated in Table 2 were each mixed with polyvinyl butyral as an organic binder, di-n-butyl phthalate as a plasticizer and a mixed solvent of toluene and isopropyl alcohol at a mixing ratio by weight of 30:70 in ratios indicated in Table 3 below.

TABLE 3

| Component | Amount parts by weight | weight |
| --- | --- | --- |
| inorganic composition (ceramic-glass comp.) | 100 | 200 g |
| polyvinyl butyral resin | 15 | 30 |
| di-n-butyl phthalate | 5 | 10 |
| toluene/isopropyl alcohol | 40 | 80 |

Each paste was applied onto an organic film by a doctor blading method and dried to obtain a green sheet with a dry thickness of 0.25 mm. The thus obtained green sheet was punched to have a given size and subjected to a procedure of making through holes as desired.

The cupric oxide paste was applied onto the respective green sheet pieces in desired patterns by a screen printing technique. Four pieces were superimposed and compressed at a temperature of 80° C. under a pressure of 150 kg/cm² to obtain a laminate with a structure of four ceramic insulating layers as shown in FIG. 1.

Figure 2:
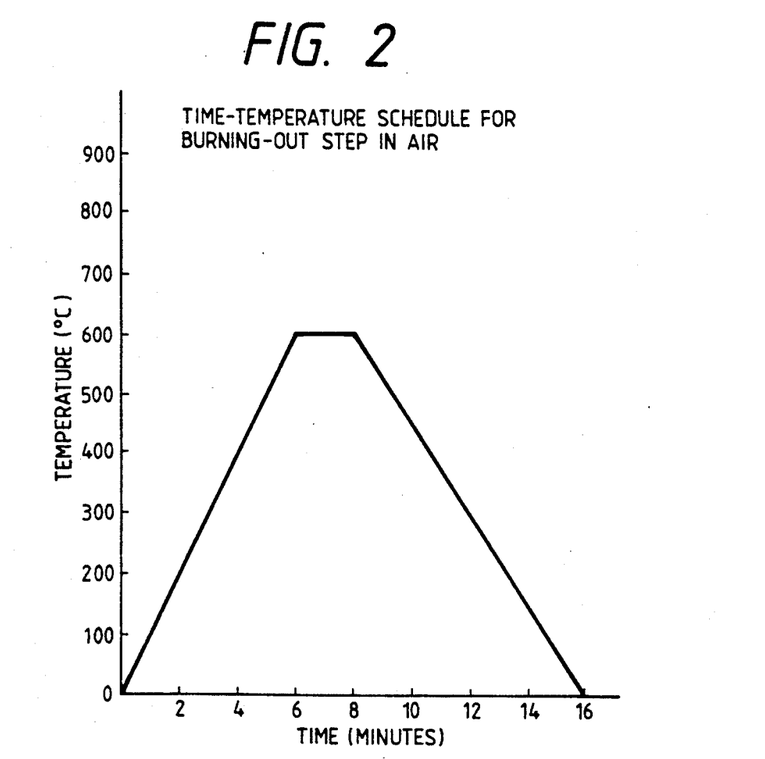
FIG. 2 is a typical temperature-time schedule for a procedure of burning out organic binder according to the invention.

The laminate was subsequently subjected to a burning-out process where the organic binders were removed. In FIG. 2, there is shown a temperature-time schedule used for the burning-out process. The green sheets and CuO paste used in this example contained the polyvinyl butyral resin and ethyl cellulose as the organic binders. These binders and plasticizer could be decomposed in air at temperatures of not lower than 500° C. In this process, the maximum temperature of 600° C. was used as will be seen from FIG. 2. The observation of the resultant laminate revealed that the ceramic substrate remained unsintered and the CuO powder underwent a slight degree of sintering, but there occurred no delamination and cracking in the substrate.

Figure 3:
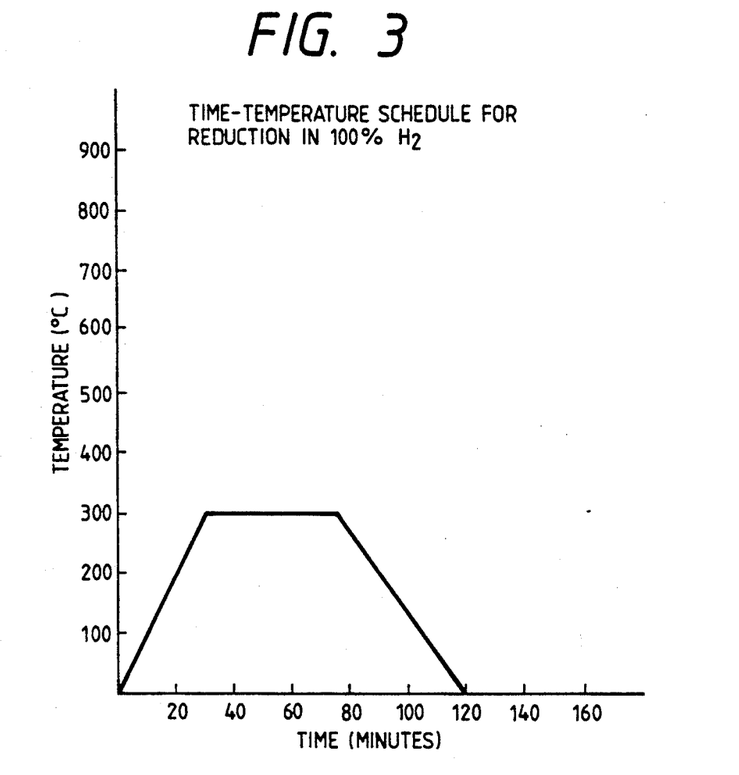
FIG. 3 is a typical temperature-time schedule for a procedure of metallizing cupric oxide by reduction.

Thereafter, the burnt-out laminate was subjected to a reduction process using an atmosphere of 100% hydrogen. This reduction process was accorded to a temperature-time schedule shown in FIG. 3. Although it was confirmed that good results of the reduction could be obtained at a concentration of hydrogen in the atmosphere of not less than 10% by volume, a difficulty might be involved in obtaining a uniform distribution in concentration of a mixed gas containing hydrogen. Accordingly, it is preferred to effect the reduction in 100% hydrogen.

It should be noted that the treating temperature may differ, generally in the range of from 200° to 400° C., depending upon the concentration of hydrogen, a temperature of from 200° C. to 300° C. in 100% hydrogen is preferred. In this temperature range, the cupric oxide is fully reduced and PbO contained in the ceramic-glass composition which is most likely to reduce among the components in the composition is not substantially reduced. The temperature range where CuO is reduced but PbO is not reduced is shifted to a higher level at a lower concentration of hydrogen and becomes narrower. This is why 100% hydrogen is preferred.

Figure 4:
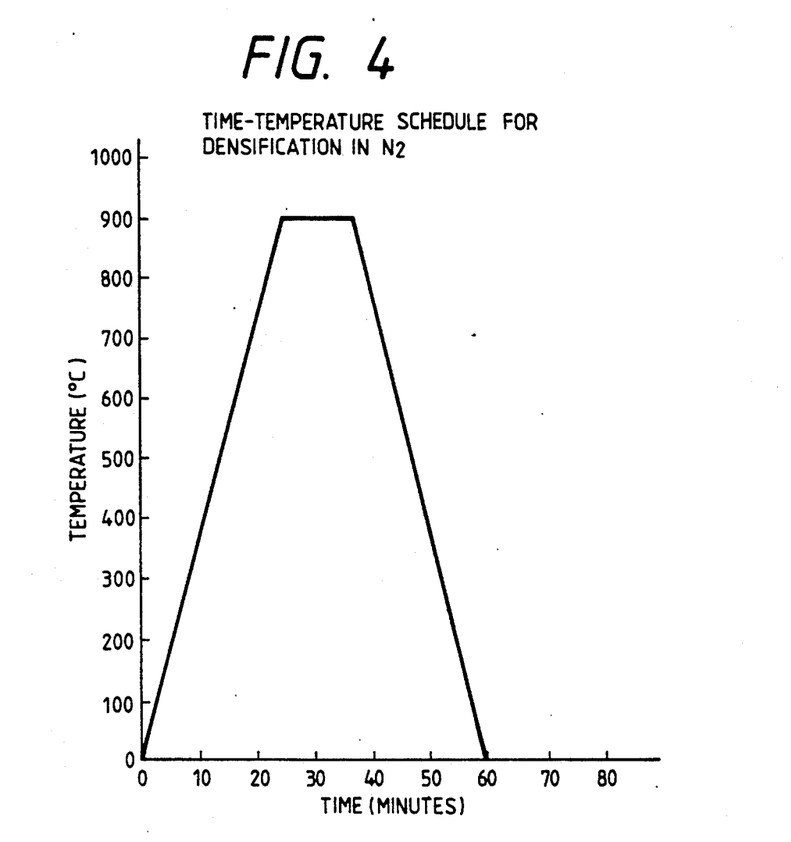
FIG. 4 is a typical temperature-time schedule for a firing procedure.

Next, the reduced laminate was subjected to firing according to the temperature-time schedule shown in FIG. 4, from which it will be seen that the maximum temperature used was 900° C. The firing process was effected in a nitrogen atmosphere by the use of a commercially available belt furnace. The measurement of the concentration of $O_2$ in the furnace by means of an $O_2$ densitometer revealed that the concentration was in the range of from 1 to 2 ppm.

Finally, a Cu paste (#9153, available from E.I. Du Pont De Nemours) was applied in the form of a desired pattern on the resultant substrate by screen printing and dried at 120° C. for 10 minutes and fired in the same manner as in FIG. 4 to form a top conductor pattern.

EXAMPLE 4

The respective substrates obtained in Example 3 were evaluated with respect to physical and electric characteristics, solderability of the top conductor layer and reliability of insulating layers. The results are shown in Table 4.

Figure 5:
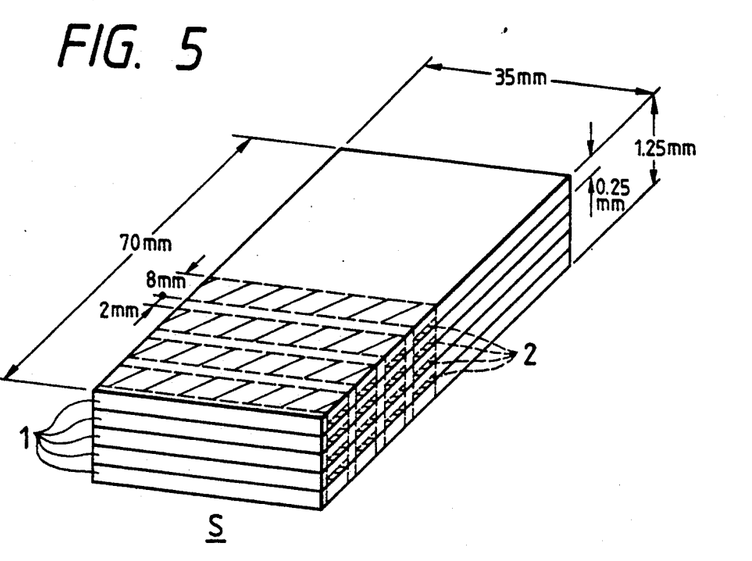
FIG. 5 is a schematic view of a substrate sample which is used to determine a degree of registration or matching between ceramic-glass layers and conductor patterns at the time of firing.

In the table, the matching of the insulating layers with internal conductors was determined as follows. As shown in FIG. 5, five green sheets 1 each having a size of 70 mm×35 mm×0.25 mm and internal conductor layers 2 formed at intervals of 2 mm were laminated, followed by burning out, reduction and firing under similar conditions as used in Example 3 to obtain a multilayered ceramic substrate. The resultant substrate was evaluated with respect to warpage and deformation.

The solderability of the top conductor layer was assessed in the following manner: each substrate obtained in Example 3 were immersed in a solder vessel at 260° C. for about 2 seconds to observe wettability of the solder. When the wetted area was not less than 90% of the total area of the conductor layer, the solderability was evaluated as good. At less than 90%, it was evaluated as bad.

Figure 6A:
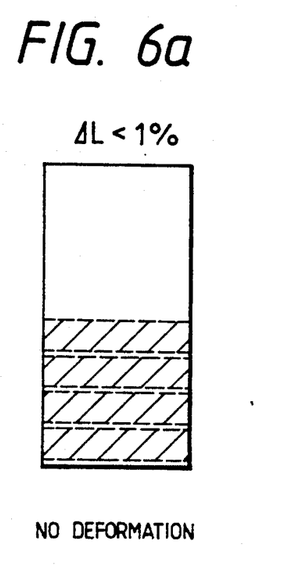
FIGS. 6a and 6b are, respectively, illustrative of a substrate free of deformation and a deformed substrate tested in examples.
Figure 6B:
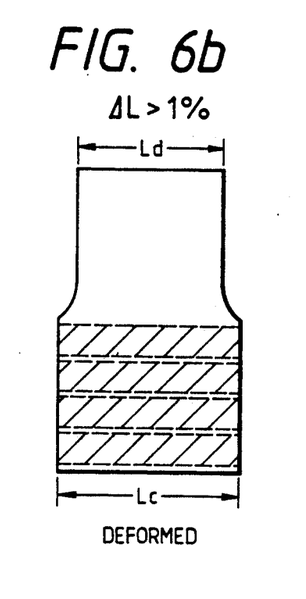

The reliability of the insulating layers was evaluated by providing counter electrodes with a size of 2 mm×2 mm inbetween 200 micrometer thick insulating layers and applying a bias voltage of 100 volts under conditions of 85° C. and 85% R.H., followed by allowing to stand over 1000 hours. Thereafter, the sample was returned to a test room and subjected to measurement of an insulation resistance. When the resistance was kept at not less than $10^{10}$ ohms, the reliability was evaluated as good. At less than $10^{10}$ ohms, the reliability was as bad.

wherein Lc is a width (mm) of the substrate where the conductors are formed as shown in FIG. 6b and Ld is a width of the substrate free of the conductors as shown in FIG. 6b.

When ΔL was less than 1%, the matching was evaluated as good. Over 1%, the matching was evaluated as bad. The results are shown in FIG. 7.

Figure 7:
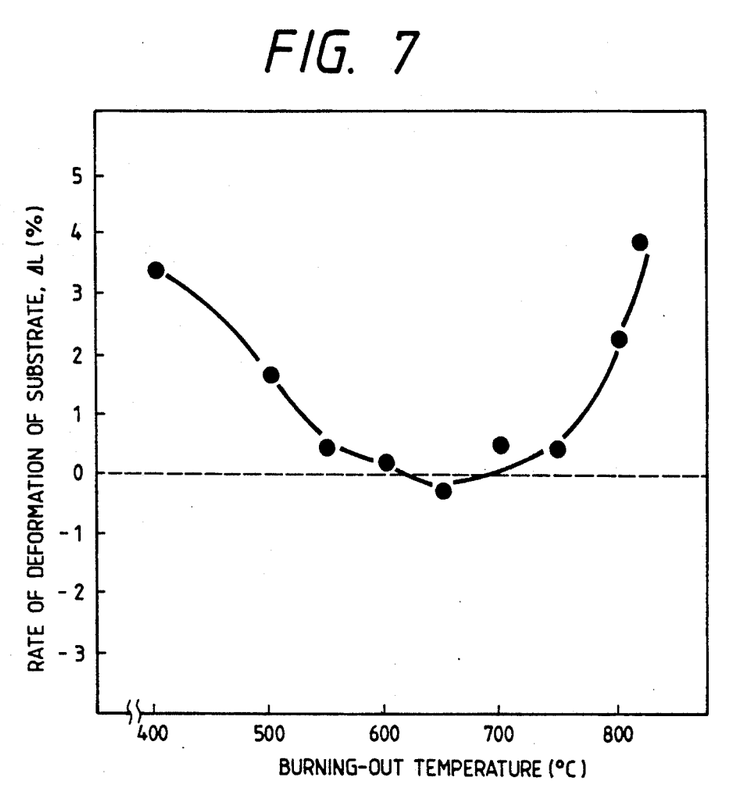
FIG. 7 is a graph showing the relationship between the thermal treating temperature in the burning-out step and the rate of deformation of substrate.

The results of FIG. 7 reveal that at temperatures lower than 500° C., the reaction between CuO particles and the substrate material does not proceed significantly and grain growth of CuO particles scarcely occurs, so that the deformation of the substrate has little difference from a known case where multilayered ceramic substrates having Cu electrodes are fired in $N_2$. At higher temperatures, the effect of the invention is shown to minimize the deformation of the substrate. On the other hand, when the burning-out temperature is 800° C. or over, the substrate shrinks and sintering of CuO proceeds with the result that a substantial degree of the deformation takes place. More particularly, when sintering of the substrate material and CuO proceeds excessively, CuO cannot be fully reduced into metallic copper in a subsequent reduction process. This in turn

TABLE 4

| Characteristic Properties | Specimen No. | | | | | | | | | | | | | | |
|---|---|---|---|---|---|---|---|---|---|---|---|---|---|---|---|
| | D-1 | D-2 | D-3 | D-4 | D-5 | D-6 | D-7 | D-8 | D-9 | D-10 | D-11 | D-12 | D-13 | D-14 | D-10 |
| Flexural Strength (kg/cm²) | 2000 | 2320 | 2600 | 2120 | 1640 | 1920 | 2240 | 2600 | 2050 | 1450 | 1800 | 1608 | 1380 | 1225 | 895 |
| Dielectric Constant (1 MHz) | 7.8 | 7.9 | 7.9 | 7.9 | — | 7.0 | 7.1 | 7.1 | 7.2 | — | 6.9 | — | — | — | — |
| Dissipation Factor (%) | 0.2 | 0.2 | 0.2 | 0.2 | — | 0.2 | 0.2 | 0.2 | 0.2 | — | 0.2 | — | — | — | — |
| Matching with Internal Conductors (Deformation of Substrate) | bad | bad | good | good | good | good | good | good | good | good | bad | bad | bad | bad | bad |
| Solderability of Top Layer | bad | bad | bad | good | good | good | good | good | good | good | good | good | good | good | good |
| Reliability of Insulating Layers | good | good | good | good | bad | good | good | good | good | bad | good | bad | bad | bad | bad |

The above results reveal that when the glass powder G-1 is used, the solderability of the top conductor layer is poor with problems involved in the deformation and reliability. With the glass powder G-3, the deformation of the substrate is so considerable that it is difficult to use. This is considered for the reason that the contraction rates of the substrate materials of D-11 to D-15 and Cu depending upon the firing temperature are not matched, thereby causing deformation as is particularly shown in FIG. 6b. It will be noted that FIG. 6a shows a multilayered ceramic substrate without any deformation. In view of the results in Tale 4, the substrate material is preferably a mixture of 45 to 60 wt % of alumina with the balance of the glass G-2.

EXAMPLE 5

The burning-out temperature of sample No. D-8 in relation to a variation in deformation of the substrate was determined at different burning-out temperatures. The degree of the deformation of the substrate after completion of the subsequent reduction and firing steps carried out in the same manner as in the foregoing examples was quantitatively defined as a rate of deformation, ΔL, according to the following equation.

$$\Delta L = \left(\frac{Lc - Ld}{Lc}\right) \times 100(\%)$$

impedes sintering of the substrate material in the final firing process, facilitating the deformation. Presumably, the reaction between the substrate material and CuO during the burning-out process is effective in suppressing the deformation of a final substrate product.

In the above examples, the multilayered ceramic substrate is fabricated according to a so-called green sheet technique. The multilayered ceramic product can be likewise obtained by a method using a sintered support. In the method, a CuO paste and a ceramic-glass composition paste as used in the green sheet technique are separately prepared and printed on the sintered ceramic support alternately in desired patterns, followed by burning out, reduction and firing in the same manner as in the green sheet method. The method using the sintered ceramic support is advantageous in that no consideration should be taken for deformation of the substrate.

What is claimed is:

1. A multilayered ceramic substrate which comprises a multilayered structure having electrode patterns of copper and ceramic layers laminated alternately, the ceramic layers consisting essentially of 45 to 60 wt % of $Al_2O_3$, 24 to 33 wt % of $SiO_2$, 2.4 to 3.3 wt % of $B_2O_3$, 1.2 to 1.65 wt % of $Na_2O$, 0.8 to 1.1 wt % of $K_2O$, 3.2 to 4.4 wt % of CaO, 1.2 to 1.65 wt % of MgO and 7.2 to 9.9 wt % of PbO.

2. The multilayered ceramic substrate according to claim 1, wherein the substrate has a copper pattern on at least one outer side thereof.

3. The multilayered ceramic substrate according to claim 1, wherein the ceramic layers have through holes in which the copper electrode is filled to interconnect the electrode patterns on the respective ceramic layers.

4. The multilayered ceramic substrate according to claim 1, wherein the ceramic substrate is formed on one or both sides of a sintered ceramic support.

5. The multilayered ceramic substrate according to claim 1, wherein said copper patterns are formed from a composition of cupric oxide and an inorganic binder in an amount of from 0.5 to 7 wt % of the total of the cupric oxide and the inorganic binder.

* * * * *